United States Patent
Kumai

(10) Patent No.: US 8,567,215 B2
(45) Date of Patent: *Oct. 29, 2013

(54) METHOD FOR PRODUCING POLARIZING ELEMENT

(75) Inventor: Yoshitomo Kumai, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 69 days.

This patent is subject to a terminal disclaimer.

(21) Appl. No.: 13/422,980

(22) Filed: Mar. 16, 2012

(65) Prior Publication Data

US 2012/0234046 A1 Sep. 20, 2012

(30) Foreign Application Priority Data

Mar. 18, 2011 (JP) ................. 2011-061050

(51) Int. Cl.
*C03C 17/09* (2006.01)
*C03B 23/037* (2006.01)
*C03B 32/00* (2006.01)

(52) U.S. Cl.
USPC ............ 65/60.1; 65/60.4; 65/60.7; 65/64; 65/32.1; 65/32.4; 359/492.01; 359/282; 359/485.03; 427/163.1; 427/171; 427/165; 204/192.1; 204/192.26

(58) Field of Classification Search
USPC ............ 65/33.1, 33.3, 33.4, 60.1, 60.4
See application file for complete search history.

(56) References Cited

U.S. PATENT DOCUMENTS

| | | | | |
|---|---|---|---|---|
| 3,325,299 A | * | 6/1967 | Araujo | 501/13 |
| 3,540,793 A | * | 11/1970 | Stookey et al. | 359/241 |
| 3,653,863 A | * | 4/1972 | Araujo et al. | 65/30.11 |
| 3,954,485 A | * | 5/1976 | Seward et al. | 501/13 |
| 4,304,584 A | * | 12/1981 | Borrelli et al. | 65/30.11 |
| 4,339,256 A | * | 7/1982 | Simms | 65/32.5 |
| 4,479,819 A | * | 10/1984 | Borelli et al. | 65/30.11 |
| 4,486,213 A | * | 12/1984 | Lentz et al. | 65/30.11 |
| 5,122,907 A | * | 6/1992 | Slocum | 359/797 |
| 5,430,573 A | * | 7/1995 | Araujo et al. | 359/361 |
| 5,517,356 A | * | 5/1996 | Araujo et al. | 359/487.06 |
| 5,864,427 A | * | 1/1999 | Fukano et al. | 359/487.06 |
| 5,886,820 A | * | 3/1999 | Tajima et al. | 359/487.06 |
| 5,999,315 A | * | 12/1999 | Fukano et al. | 359/484.03 |
| 6,089,042 A | * | 7/2000 | Gill et al. | 65/30.1 |
| 6,122,103 A | * | 9/2000 | Perkins et al. | 359/485.03 |
| 6,171,762 B1 | * | 1/2001 | Borrelli et al. | 430/314 |
| 6,298,691 B1 | * | 10/2001 | Borrelli et al. | 65/30.1 |
| 6,524,773 B1 | * | 2/2003 | Borrelli et al. | 430/322 |
| 6,536,236 B2 | * | 3/2003 | Grossman et al. | 65/30.11 |
| 6,563,639 B1 | * | 5/2003 | Borrelli et al. | 359/484.03 |
| 6,606,885 B2 | * | 8/2003 | Harris et al. | 65/30.11 |
| 6,772,608 B1 | * | 8/2004 | Drost et al. | 65/30.1 |

(Continued)

FOREIGN PATENT DOCUMENTS

| JP | 56-169140 | 12/1981 |
|---|---|---|
| JP | 07-120615 | 5/1995 |
| JP | 4394355 | 10/2009 |

*Primary Examiner* — Jason L Lazorcik

(74) *Attorney, Agent, or Firm* — Workman Nydegger

(57) ABSTRACT

A method for producing a polarizing element includes the steps of: forming an island-shaped film of a metal halide on a glass substrate; forming needle-shaped particles of the metal halide by stretching the glass substrate through heating to elongate the island-shaped film; and forming needle-shaped metal particles composed of a metal by reducing the metal halide of the needle-shaped particles, wherein the metal halide is deposited on the glass substrate by a reactive physical vapor deposition method.

3 Claims, 2 Drawing Sheets

FILM FORMATION (S1)

ETCHING (S2)

(56) References Cited

U.S. PATENT DOCUMENTS

| | | | | |
|---|---|---|---|---|
| 6,775,062 | B2 * | 8/2004 | Borrelli et al. | 359/484.03 |
| 6,777,359 | B2 * | 8/2004 | Yamashita et al. | 501/67 |
| 6,912,087 | B1 * | 6/2005 | Borrelli et al. | 359/485.03 |
| 7,104,090 | B2 * | 9/2006 | Borrelli et al. | 65/32.1 |
| 7,230,760 | B2 * | 6/2007 | Naylor et al. | 359/484.03 |
| 7,468,148 | B2 * | 12/2008 | Borrelli et al. | 252/500 |
| 7,510,989 | B2 * | 3/2009 | Borrelli et al. | 501/32 |
| 7,618,908 | B2 * | 11/2009 | Borrelli et al. | 501/19 |
| 7,648,656 | B2 * | 1/2010 | Borrelli et al. | 252/514 |
| 7,817,340 | B2 * | 10/2010 | Borrelli et al. | 359/487.06 |
| 8,077,389 | B2 * | 12/2011 | Jabri et al. | 359/487.02 |
| 8,114,797 | B2 * | 2/2012 | Yoneda et al. | 501/56 |
| 8,174,764 | B2 * | 5/2012 | Yoneda | 359/484.03 |
| 8,179,595 | B2 * | 5/2012 | Borrelli et al. | 359/361 |
| 2002/0053221 | A1 * | 5/2002 | Grossman et al. | 65/32.1 |
| 2003/0136152 | A1 * | 7/2003 | Borrelli et al. | 65/32.1 |
| 2003/0202245 | A1 * | 10/2003 | Borrelli et al. | 359/492 |
| 2006/0247117 | A1 * | 11/2006 | Borrelli et al. | 501/10 |
| 2007/0093373 | A1 * | 4/2007 | Borrelli et al. | 501/2 |
| 2007/0093374 | A1 * | 4/2007 | Borrelli et al. | 501/2 |
| 2007/0125126 | A1 * | 6/2007 | Ichimura et al. | 65/33.1 |
| 2007/0141350 | A1 * | 6/2007 | Borrelli et al. | 428/410 |
| 2007/0153383 | A1 * | 7/2007 | Borrelli et al. | 359/492 |
| 2009/0190214 | A1 * | 7/2009 | Borrelli et al. | 359/486 |
| 2009/0190215 | A1 * | 7/2009 | Borrelli et al. | 359/488 |
| 2010/0167904 | A1 * | 7/2010 | Ichimura et al. | 501/32 |
| 2011/0255161 | A1 * | 10/2011 | Yoneda | 359/484.03 |
| 2012/0192592 | A1 * | 8/2012 | Borrelli et al. | 65/32.5 |

* cited by examiner

FILM FORMATION (S1)

ETCHING (S2)

STRETCHING (S3)

REDUCTION (S4)

METHOD FOR PRODUCING POLARIZING ELEMENT

BACKGROUND

1. Technical Field

The present invention relates to a method for producing a polarizing element.

2. Related Art

As one type of polarizing element, a polarizing glass is known. A polarizing glass can be composed of only an inorganic substance, and therefore, as compared with a polarizing plate containing an organic substance, the deterioration thereof due to light is significantly less. Therefore, a polarizing glass has drawn attention as an effective optical device in a liquid crystal projector whose brightness has been enhanced recently.

As a general polarizing glass, those described in JP-A-56-169140 are known, and a method for producing such a polarizing glass is as follows.

(1) A glass product having a desired shape is produced from a composition containing silver and at least one halide selected from the group consisting of chlorides, bromides, and iodides.

(2) The produced glass product is heated to a temperature which is higher than the strain point but not higher than the softening point of the glass by about 50° C. for a period of time sufficient to produce crystals of AgCl, AgBr, or AgI in the glass product, whereby a crystal-containing product is produced.

(3) The resulting crystal-containing product is elongated under stress at a temperature which is higher than the annealing point but lower than a temperature at which the glass has a viscosity of about 108 poises so that the crystals are elongated to have an aspect ratio of at least 5:1.

(4) The elongated product is exposed to a reducing atmosphere at a temperature which is higher than about 250° C. but not higher than the annealing point of the glass by about 25° C. for a period of time sufficient to develop a chemically reduced surface layer on the product. By this process, at least a portion of the elongated silver halide particles are reduced to elemental silver.

Meanwhile, there is also known a method in which after silver or copper is introduced into a glass surface layer by an ion exchange method, a silver or copper halide phase is deposited, and the deposited halide phase is elongated, thereby forming a layer having a polarization separation function on the surface layer of a glass product (see Japanese Patent No. 4394355).

According to the production method described in JP-A-56-169140, the halide deposits uniformly in the glass product, however, in the reducing step, the halide only in the surface layer of the glass product can be reduced, and therefore, the halide remains in a central portion in the thickness direction of the glass product. Due to this, the transmittance of a polarizing element is decreased and when the glass product is applied to a liquid crystal display apparatus or the like, there is a possibility that a sufficient brightness cannot be obtained.

On the other hand, according to the method described in Japanese Patent No. 4394355, silver or copper is introduced only into a surface layer portion of the glass product, and therefore, the above problem caused by the halide remaining without being reduced can be prevented. However, it is necessary to immerse the glass product in a molten salt at a high temperature (350 to 750° C.) for as long as about 8 hours, and therefore, an environmental load is large. In other words, the consumption energy for the production is extremely large and the productivity is low.

SUMMARY

An advantage of some aspects of the invention is to provide a method for simply producing a polarizing element having excellent optical properties.

A method for producing a polarizing element according to an aspect of the invention includes the steps of: forming an island-shaped film of a metal halide on a glass substrate; forming needle-shaped particles of the metal halide by stretching the glass substrate through heating to elongate the island-shaped film; and forming needle-shaped metal particles composed of a metal by reducing the metal halide of the needle-shaped particles, wherein the metal halide is deposited on the glass substrate by a reactive physical vapor deposition method.

According to this production method, an island-shaped film is formed on a surface of a glass substrate, and the island-shaped film is stretched to form needle-shaped particles, followed by reduction, thereby forming needle-shaped metal particles. Therefore, the metal halide can be reliably reduced. Thus, deterioration of the optical properties due to the residual metal halide is not caused. Further, since the island-shaped film of the metal halide is formed on the glass substrate using a thin-film forming step, the production can be performed by a significantly simple step as compared with the related art step in which a metal is introduced into a surface layer of a glass by ion exchange. Thus, the consumption energy for the production can be extremely reduced, and also the productivity can be increased.

The production method may be configured such that the step of forming the island-shaped film includes the steps of: forming a coating film composed of the metal halide on the glass substrate by the reactive physical vapor deposition method; and forming the island-shaped film by etching the coating film.

According to this configuration, a condition for etching the coating film can be selected independently of the step of forming the coating film, and therefore, the arrangement density of the island-shaped particles constituting the island-shaped film can be easily controlled, and also the optical properties of the polarizing element can be easily controlled.

The production method may be configured such that the etching process is a dry etching process using an inert gas or a reactive gas.

According to this configuration, the island-shaped film of a metal halide can be formed simply in high yield.

The production method may be configured such that the reactive physical vapor deposition method is a reactive sputtering method using a target composed of one or more metals selected from Au, Ag, Cu, Cd, and Al and a process gas containing a halogen gas.

According to this configuration, the metal halide can be formed on the glass substrate at high speed in high yield, and therefore, the polarizing element can be efficiently produced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings.

Incidentally, the scope of the invention is not limited to the following embodiments and can be arbitrarily changed within the scope of the technical idea of the invention. Further, in the following drawings, in order to make each structure easily understandable, the scale, the number, or the like in each structure is made different from that in the actual structure in some cases.

FIGS. 1A to 1D are views for illustrating a method for producing a polarizing element according to this embodiment.

As shown in FIGS. 1A to 1D, the method for producing a polarizing element according to this embodiment includes a film forming step S1, an etching step S2, a stretching step S3, and a reducing step S4.

Figure 1A:
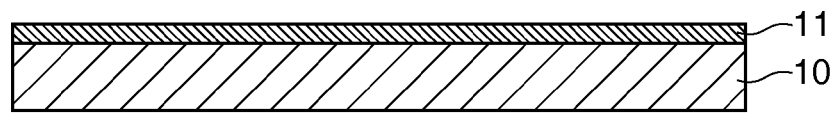
FIGS. 1A to 1D are views for illustrating a method for producing a polarizing element according to an embodiment.

As shown in FIG. 1A, the film forming step S1 is a step of forming a coating film 11 composed of a metal halide on a glass substrate 10 using a reactive physical vapor deposition method.

The glass substrate 10 is not particularly limited, and any known glass substrate can be used. This is because in the method for producing a polarizing element according to this embodiment, it is not necessary to deposit a metal halide in the glass substrate or introduce a metal ion into the surface of the glass substrate by ion exchange, and the glass substrate may be any as long as the coating film 11 of a metal halide can be formed thereon. Specifically, any of various glass substrates such as quartz glass, soda lime glass, sapphire glass, borosilicate glass, and aluminoborosilicate glass can be used according to the intended use of the polarizing element.

The reactive physical vapor deposition method is a film formation method for forming a thin film of a compound by a reaction during physical vapor deposition. In the case of this embodiment, by a reaction between metal particles scattered by a physical vapor deposition method and a halogen contained in a reaction gas, the coating film 11 composed of a metal halide is formed on the glass substrate 10.

The physical vapor deposition method is not particularly limited, and either of an evaporation-based physical vapor deposition method and a sputtering-based physical vapor deposition method may be used. Examples of the evaporation-based physical vapor deposition method include a vacuum vapor deposition method, a molecular beam vapor deposition method (MBE), an ion plating method, and an ion beam vapor deposition method. Examples of the sputtering-based physical vapor deposition method include magnetron sputtering, ion beam sputtering, and ECR sputtering.

In the film forming step S1, for example, in the case of using a reactive sputtering method, a target composed of one or more metals selected from Au, Ag, Cu, Cd, and Al can be used as a metal target. As the reaction gas, a halogen (F, Cl, Br, I, At, or Uus) gas or a halogen compound gas is used. Examples of the metal halide to be formed using these include AgClx, AlF, AgF, AgBr, AgI, and AlClx.

The halogen compound gas is not particularly limited, however, examples thereof include boron compounds such as $BCl_3$, $BBr_3$, and $BF_3$; fluorocarbon compounds such as $CF_4$ and $C_2F_6$; germanium compounds such as $GeCl_4$ and $GeF_4$; silicon compounds such as $SiCl_4$ and $SiF_4$; silane compounds such as $SiHCl_3$ and $SiH_2Cl_2$; $NF_3$, $PF_3$, $SF_6$, $SnCl_4$, $TiCl_4$, and $WF_6$.

Figure 1B:
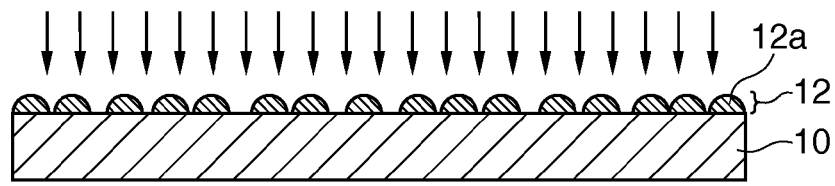

Subsequently, as shown in FIG. 1B, the etching step S2 is a step of forming an island-shaped film 12 composed of a large number of island-shaped particles 12a by etching the coating film 11 formed in the film forming step S1.

As the etching process, a dry etching process is preferably used. In the dry etching process, a gas species may be selected according to the material of the coating film 11. That is, a sputter etching process using an inert gas (such as Ar) may be performed or a reactive dry etching process using a reactive gas (such as $Cl_2$, $BCl_3$, HBr, $CF_4$, or $SF_6$) may be performed.

Figure 2A:
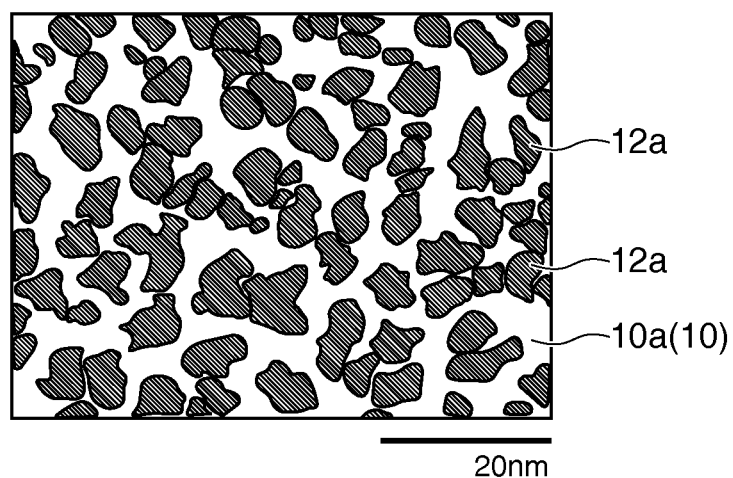
FIG. 2A is a plan view for illustrating a surface of a glass substrate after an etching step.

FIG. 2A is a plan view for illustrating the surface of the glass substrate after the etching step. As shown in FIG. 2A, by the above-described etching process, island-shaped particles 12a composed of a metal halide (such as AgClx or AlF) having a particle diameter of about 2 to 8 nm are formed. In a region among the island-shaped particles 12a, a region 10a in which the surface of the glass substrate 10 is exposed is formed.

In the etching step S2 according to this embodiment, the coating film 11 is formed into the island-shaped film 12 by partially removing the coating film 11, and therefore, it is preferred to perform the etching process in a state capable of easily controlling the process by making the etching condition for the coating film 11 mild. Specifically, an etching rate is preferably set in a range of 10 nm/min to 100 nm/min although it depends on the thickness of the coating film 11.

Incidentally, in this embodiment, a uniform coating film 11 is formed in the film forming step S1, and thereafter the coating film 11 is processed into the island-shaped film 12 in the etching step S2. However, in the case where the island-shaped film 12 is formed in the film forming step S1, the etching step S2 is not required. In the film forming step S1 according to this embodiment, a metal halide is formed into a film using a reactive physical vapor deposition method. A metal halide can easily evaporate, and therefore, by adjusting the balance between deposition of the metal halide on the glass substrate 10 and evaporation of the metal halide from the glass substrate 10, the island-shaped film 12 as shown in FIG. 2A can be formed by the film forming step S1.

Figure 1C:
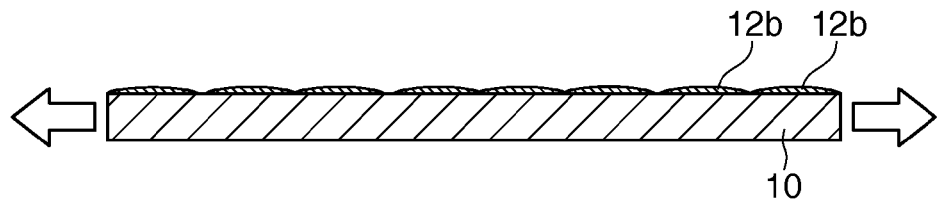

Subsequently, in the stretching step S3, as shown in FIG. 1C, the glass substrate 10 softened by heating is stretched in a direction parallel to the plane of the glass substrate 10 on which the island-shaped particles 12a are formed. As a method for stretching the glass substrate 10, a stretching process in which the glass substrate 10 is stretched in a direction parallel to the plane of the glass substrate 10 may be used or a rolling process in which the glass substrate 10 is rolled thin by pressure may be used. The heating temperature in the stretching step S3 is not particularly limited, and the glass substrate 10 may be heated to a temperature at which the glass substrate 10 can be softened without melting.

Figure 2B:
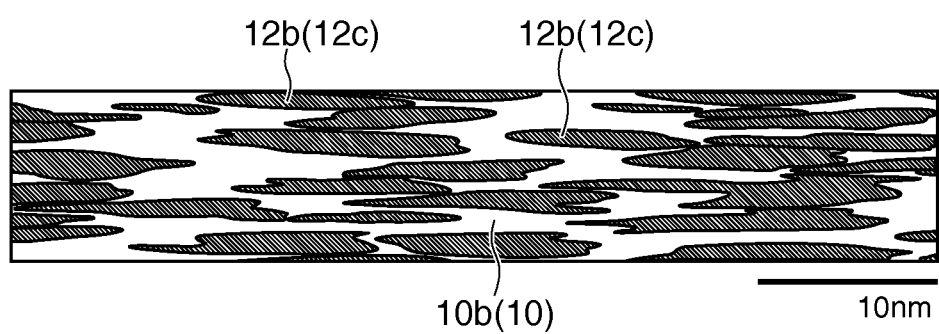
FIG. 2B is a plan view for illustrating the surface of the glass substrate after a stretching step.

By the stretching step S3, the glass substrate 10 is stretched in a stretching direction and processed thin. In addition, the island-shaped particles 12a on the glass substrate 10 are also stretched in the stretching direction, and, as shown in FIG. 2B, formed into a large number of needle-shaped particles 12b oriented in a stretching direction (in a horizontal direction in FIG. 2B) on the glass substrate 10. The needle-shaped particles 12b have an elongated shape with an aspect ratio of 5 or more, and for example, have a width of about 1 to 3 nm and a length of about 5 to 20 nm.

Further, in a region among a plurality of needle-shaped particles 12b, an elongated slit-shaped region 10b is formed by stretching the region 10a shown in FIG. 2A. As for the size of the slit-shaped region 10b, although it varies depending on the density of the formed island-shaped particles 12a, the width thereof is from about 1 to 10 nm and the length thereof is from about 3 to 50 nm.

Figure 1D:
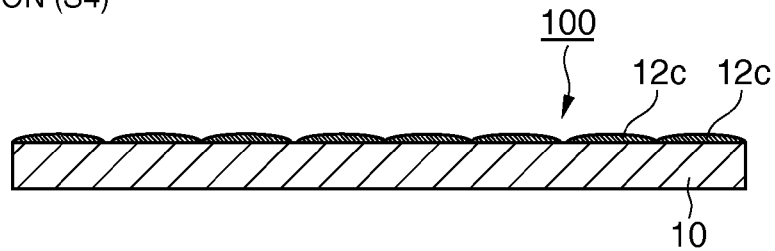

Subsequently, in the reducing step S4, as shown in FIG. 1D, the glass substrate 10 is placed in a reducing atmosphere such as hydrogen and is also heated, whereby the metal halide constituting the needle-shaped particles 12b is reduced. By this step, needle-shaped metal particles 12c are formed on the glass substrate 10. For example, in the case where the needle-shaped particles 12b are composed of AgClx, needle-shaped metal particles 12c composed of Ag are formed. In the case where the needle-shaped particles 12b are composed of AlF, needle-shaped metal particles 12c composed of Al are formed.

According to the above-described steps, a polarizing element 100 in which a large number of needle-shaped metal particles 12c which are oriented in the same direction in a plane of the glass substrate 10 are arranged with the slit-shaped region 10b interposed thereamong can be formed on the glass substrate 10.

The polarizing element 100 produced by the production method according to this embodiment can be used as an optical element which has a function of separating transmitted light into linearly polarized light in a predetermined vibrating direction since the needle-shaped metal particles 12c having a width less than that of the wavelength of visible light are arranged at a narrow pitch.

Further, in the polarizing glass of the related art, the arrangement density of the needle-shaped metal particles was about 20 particles or less per cubic micrometer, and therefore, in order to obtain high polarization separation performance, it was necessary to distribute the needle-shaped metal particles widely in a thickness direction of the glass substrate. On the other hand, in the polarizing element according to this embodiment, the needle-shaped metal particles 12c are arranged at a high density on the surface of the glass substrate 10, and therefore, the glass substrate 10 having an arbitrary thickness can be used, and it is also easy to produce a thin polarizing element.

According to the production method of this embodiment described in detail above, the island-shaped particles 12a composed of a metal halide are formed on the surface of the glass substrate 10 using a thin-film forming technique, followed by stretching and reduction, and therefore, the metal halide can be reliably reduced and the needle-shaped metal particles 12c composed of only a metal can be easily and reliably obtained. Accordingly, unlike the polarizing glass of the related art, the light transmittance of the polarizing element is not decreased by a residual metal halide in the glass substrate.

Further, since a thin-film forming technique such as a reactive sputtering or dry etching process is used for forming the island-shaped particles 12a, there is no need for a production step in which a glass substrate is immersed in a molten salt at a high temperature for a long period of time, for example, a process of introducing a metal element into a surface layer portion of a glass substrate by ion exchange. Accordingly, the consumption energy for the production can be extremely reduced and an environmental load can be reduced. Further, the production method according to this embodiment is excellent in productivity as compared with the production method of the related art.

Further, according to the production method of this embodiment, the island-shaped film 12 is formed by partially removing the coating film 11 in the etching step S2, and therefore, the arrangement density of the island-shaped particles 12a can be extremely easily controlled. That is, the optical properties of the polarizing element can be extremely easily controlled.

Incidentally, in the case where the island-shaped film 12 is formed in the film forming step S1, a ratio between the island-shaped particles 12a and the region 10a may be adjusted by adjusting the film forming condition.

Further, according to the production method of this embodiment, the formation of the coating film 11 or the island-shaped particles 12a of a metal halide is performed using a reactive physical vapor deposition method, and therefore, it is easy to change the material of the metal halide to another material, and even a material which could not be used in the process for producing a polarizing glass of the related art can be used. Since the range of selection of the materials is widened in this manner, it becomes easy to control the optical properties of the polarizing element and also it becomes easy to increase the productivity.

EXAMPLES

Hereinafter, the invention will be described in more detail with reference to Examples, however, the technical scope of the invention is not limited to the following Examples.

Example 1

A glass substrate was disposed in a vacuum vessel of a parallel plate type sputtering apparatus to which an Ag target (purity: 99.99%, thickness: 5 mm, shape: disk) was attached as a metal target (a distance between the substrate and the target: 110 mm). Subsequently, while introducing a mixed gas containing Ar gas (purity: 99.999%, flow rate: 40 sccm) and Cl gas (flow rate: 10 sccm) into the vacuum vessel to give a pressure of 0.4 Pa, an AC power (oscillation frequency: 13.56 MHz) was applied to the Ag target at 500 W, and film formation was performed for 10 minutes. By doing this, sputtered Ag particles were allowed to fly on the glass substrate to react with Cl and deposited on the glass substrate, whereby an AgClx film having a thickness of 321 nm was formed on the glass substrate.

Subsequently, the glass substrate having the AgClx film formed thereon was placed in a vacuum vessel of an ICP dry etcher. Then, an AC power (oscillation frequency: 13.56 MHz) was applied to an ICP antenna at 300 W and to a substrate bias at 120 W while introducing Ar gas (flow rate: 100 sccm) into the vacuum vessel to give a pressure of 0.4 Pa, and the coating film 11 was etched by Ar plasma. By this etching process, an island-shaped film similar to that shown in FIG. 2A could be formed on the glass substrate.

Subsequently, by stretching the glass substrate, the island-shaped film was stretched along with the glass substrate, whereby needle-shaped particles 12b having a shape as shown in FIG. 2B could be obtained. Further, by reducing the metal halide constituting the needle-shaped particles 12b, needle-shaped metal particles 12c composed of Ag were formed.

Example 2

A glass substrate was disposed in a vacuum vessel of a parallel plate type sputtering apparatus to which an Al target (purity: 99.99%, thickness: 5 mm, shape: disk) was attached as a metal target (a distance between the substrate and the target: 110 mm). Subsequently, while introducing a mixed gas containing Ar gas (purity: 99.999%, flow rate: 45 sccm) and $CF_4$ gas (flow rate: 5 sccm) into the vacuum vessel to give a pressure of 0.4 Pa, an AC power (oscillation frequency: 13.56 MHz) was applied to the Al target at 300 W, and film formation was performed for 10 minutes. By doing this, sputtered Al particles were allowed to fly on the glass substrate to react with F and deposited on the glass substrate, whereby an AlF film having a thickness of 212 nm was formed on the glass substrate.

Subsequently, in the same manner as in Example 1, a dry etching process using an ICP dry etcher was performed and the AlF film was etched. By this etching process, an island-shaped film similar to that shown in FIG. 2A could be formed on the glass substrate.

Subsequently, by stretching the glass substrate, the island-shaped film was stretched along with the glass substrate, whereby needle-shaped particles 12b having a shape as shown in FIG. 2B could be obtained. Further, by reducing the metal halide constituting the needle-shaped particles 12b, needle-shaped metal particles 12c composed of Al were formed.

In Examples 1 and 2, an island-shaped monolayer film was formed on a glass substrate, and the glass substrate was stretched. However, if the performance as a polarizing element is not sufficient by forming only a monolayer as the island-shaped film, after a plurality of island-shaped films are laminated on a glass substrate, the resulting glass substrate may be stretched.

In this case, a transparent insulating film is formed on an island-shaped film as a first layer, and then, an island-shaped film as a second layer is formed on the insulating film. By providing the insulating film between the island-shaped film as the first layer and the island-shaped film as the second layer, the laminated two island-shaped films are prevented from fusing with each other. If there is a need for an island-shaped film as a third layer, another transparent insulating film is further formed on the island-shaped film as the second layer, and then, an island-shaped film as a third layer may be formed on the second layer through the insulating film. As a material for the insulating film, a transparent material such as silicon oxide, silicon nitride, titanium oxide, or zirconium oxide can be used. The thickness of the insulating film is not particularly limited, however, it can be set to, for example, 100 nm. After a plurality of the island-shaped films are laminated as described above, the glass substrate is stretched so as to stretch the plurality of the island-shaped films along with the glass substrate, whereby needle-shaped particles 12b having a shape as shown in FIG. 2B in plan view can be obtained.

Further, by reducing the metal halide constituting the needle-shaped particles 12b, needle-shaped metal particles 12c can be formed.

As described above, it was confirmed by using various of materials that an island-shaped film having a shape similar to that of the island-shaped film 12 shown in FIG. 2A can be formed. Such an island-shaped film is an assembly of island-shaped particles composed of $AgCl_x$ or AgF, and therefore, by stretching the glass substrate, such an island-shaped film is stretched along with the glass substrate, and needle-shaped particles 12b having a shape shown in FIG. 2B can be obtained. In this manner, according to the invention, a polarizing element having excellent optical properties can be simply produced with an extremely small environmental load as compared with the related art.

The entire disclosure of Japanese Patent Application No. 2011-061050, filed on Mar. 18, 2011 is expressly incorporated by reference herein.

What is claimed is:

1. A method for producing a polarizing element, comprising the steps of:
    forming an island-shaped film of a metal halide on a glass substrate;
    wherein the step of forming the island-shaped film includes the steps of:
    forming a coating film composed of the metal halide on the glass substrate by a reactive physical vapor deposition method; and
    forming the island-shaped film by etching the coating film,
    forming needle-shaped particles of the metal halide by stretching the glass substrate through heating to elongate the island-shaped film; and
    forming needle-shaped metal particles composed of a metal by reducing the metal halide of the needle-shaped particles, wherein
    the metal halide is deposited on the glass substrate by a reactive physical vapor deposition method.

2. The method for producing a polarizing element according to claim 1, wherein the etching process is a dry etching process using an inert gas or a reactive gas.

3. The method for producing a polarizing element according to claim 1, wherein the reactive physical vapor deposition method is a reactive sputtering method using a target composed of one or more metals selected from Au, Ag, Cu, Cd, and Al and a process gas containing a halogen gas.

* * * * *